United States Patent [19]

Moore

[11] Patent Number: 5,195,096
[45] Date of Patent: Mar. 16, 1993

[54] METHOD OF FUNCTIONALLY TESTING CACHE TAG RAMS IN LIMITED-ACCESS PROCESSOR SYSTEMS

[75] Inventor: Matthew P. Moore, Bellevue, Wash.

[73] Assignee: John Fluke Mfg. Co., Inc., Everett, Wash.

[21] Appl. No.: 849,652

[22] Filed: Mar. 9, 1992

Related U.S. Application Data

[63] Continuation of Ser. No. 494,677, Mar. 16, 1990, abandoned.

[51] Int. Cl.[5] .............................................. G11C 29/00
[52] U.S. Cl. ................................. 371/21.1; 371/51.1; 371/25.1
[58] Field of Search .............. 371/21.1, 51.1, 21.2, 371/21.3, 25.1, 15.1, 13, 24, 10.1, 27, 10.2

[56] References Cited

U.S. PATENT DOCUMENTS

| | | | |
|---|---|---|---|
| 3,714,403 | 1/1973 | Ammann et al. | 371/21.2 |
| 3,789,204 | 1/1974 | Barlow | 371/51.1 |
| 4,058,851 | 11/1977 | Scheuneman | 371/13 |
| 4,112,502 | 9/1978 | Scheuneman | 371/13 |
| 4,483,003 | 11/1984 | Beal | 371/51.1 |
| 4,575,772 | 3/1986 | Keeley | 371/21.2 |
| 4,577,289 | 3/1986 | Comerford et al. | 364/900 |
| 4,698,747 | 10/1987 | Thompson et al. | 364/200 |
| 4,715,034 | 12/1987 | Jacobson | 371/21 |
| 4,724,518 | 2/1988 | Steps | 364/200 |
| 4,799,220 | 1/1989 | Nielsen | 371/25 |
| 4,873,705 | 10/1989 | Johnson | 371/21.2 |
| 4,920,536 | 4/1990 | Hammond et al. | 371/51.1 |
| 4,953,073 | 8/1990 | Moussouris et al. | 364/200 |
| 4,959,835 | 9/1990 | Yosida et al. | 371/51.1 |
| 5,003,506 | 3/1991 | Itaya | 364/900 |

*Primary Examiner*—Robert W. Beausoliel
*Assistant Examiner*—Phung My Chung
*Attorney, Agent, or Firm*—George T. Noe

[57] ABSTRACT

A method of functionally testing cache tag RAMs in processor systems where the kernel is typically inaccessible. A test program first determines whether a fault exists at all within the cache tag RAM. If a fault is determined to exist, the faulty RAM location is exercised by sequentially applying patterns of ones and zeros until the pattern of bits actually present at the faulty tag RAM location is determined. A comparison of this pattern of bits with the expected bit pattern provides information as the precise location of the fault so as to permit replacement of defective chips.

1 Claim, 2 Drawing Sheets

METHOD OF FUNCTIONALLY TESTING CACHE TAG RAMS IN LIMITED-ACCESS PROCESSOR SYSTEMS

This application is a continuation of application Ser. No. 07/494,677, filed on Mar. 16, 1990 now abandoned.

TECHNICAL FIELD OF THE INVENTION

The present invention relates generally to the functional testing of memories, and in particular to the functional testing of cache tag RAMs in processor systems in which the kernel is either inaccessible for external testing or has only limited access.

BACKGROUND OF THE INVENTION

There are many well-known methods of performing functional testing of memories to locate faults or malfunctions which affect operation of microprocessor-based systems. For example, it is well known to exercise or test memories by external apparatus which apply test data in predetermined sequences and retrieve results for comparison with expected values. Such external test apparatus typically accesses the system under test by connecting directly into the microprocessor socket or through a peripheral interface adapter into the bus architecture and reads the test results directly.

Some of the newer microprocessor systems have cache memory within the system kernel that simply is not accessible by external test equipment or whose contents cannot be read. One such example is the cache tag RAMs of the R2000 RISC (Reduced-Instruction-Set-Computing) microprocessor system developed by MIPS Computer Systems.

The R2000 implements within the system kernel instruction and data caches which each include a 64-kilobyte random-access memory (64 K RAM) and an associated tag RAM, both addressed by the least significant bits of the address emitted by the R2000 processor. A particular cache location contains the data presumed present at some location in the main memory (situated outside the system kernel), the most significant address bits of the main-memory location (called tag bits), a valid bit, and several parity bits.

Normally, during a "read" operation, the tag bits are compared with the most significant bits of a desired address emitted by the R2000 processor. If this comparison succeeds, the "read" operation is completed and the processor moves on to its next task. If this comparison fails, a main memory "read" cycle is initiated automatically to update the cache with the correct data and appropriate tag bits.

The cache may also be isolated for diagnostic access. In this state a "read" operation returns the data value stored in that cache location; however, the cache tag RAM contents are only presumed to be what they should be since they are not returned. Status bits are available within the R2000 processor that tell whether the tag comparison succeeded or failed, and whether the parity bits were correct or incorrect. As in conventional RAM tests, it would be desirable to perform "write" and "read" operations to check the functionality of the cache tag RAMs; however, the cache tag RAM contents are not available outside the system kernel and there is no direct way to read the cache tag RAM contents. If the tag comparison fails, indicating an error in the cache tag RAMs, there is no obvious way to discover the bit pattern that was actually returned. This information is required in order to determine which one of the many chips in the cache tag subsystem is defective and needs to be replaced.

SUMMARY OF THE INVENTION

In accordance with the present invention, a solution to the foregoing problem is provided by a software program that first determines whether a fault exists within a cache tag RAM, and then, if a fault does exist, determines the pattern of bits present at the faulty tag RAM location. A comparison of this pattern of bits with the expected bit pattern yields information as to precise location of the fault (and which chip to replace).

To determine the threshold matter of whether a fault exists at all within the cache tag RAM, the cache data RAM is first verified to be functioning correctly, which can be done by standard techniques. Then, both the cache tag and cache data RAMs are loaded with the same pattern of bits at each location. The pattern of bits in the cache data RAM is used as the most significant bits of the address in making the comparison with the tag bits during a read operation. If the comparison succeeds, no fault is deemed to exist. If the comparison fails, a fault is deemed to exist because the pattern of bits read from the cache tag RAM is not what it was expected to be.

To discover what the pattern of tag bits actually is, the cache location is read iteratively, using a different pattern of data bits for each read operation until one is found that matches the pattern of tag bits as indicated by a successful comparison. The matching pattern of data bits can be read directly by the test apparatus since it comes from the cache data RAM. Although it would seem that trying different patterns until a match is found would be very time consuming, in actual practice only a maximum of a few seconds would be required for the processor to try all possibilities, even though there may be over a million possibilities, due to its sheer processing speed.

It is therefore a principal feature of the present invention to provide a method of functionally testing and diagnosing cache tag RAMs in processor systems in which visibility of the contents of cache tag RAMs is limited or impossible.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
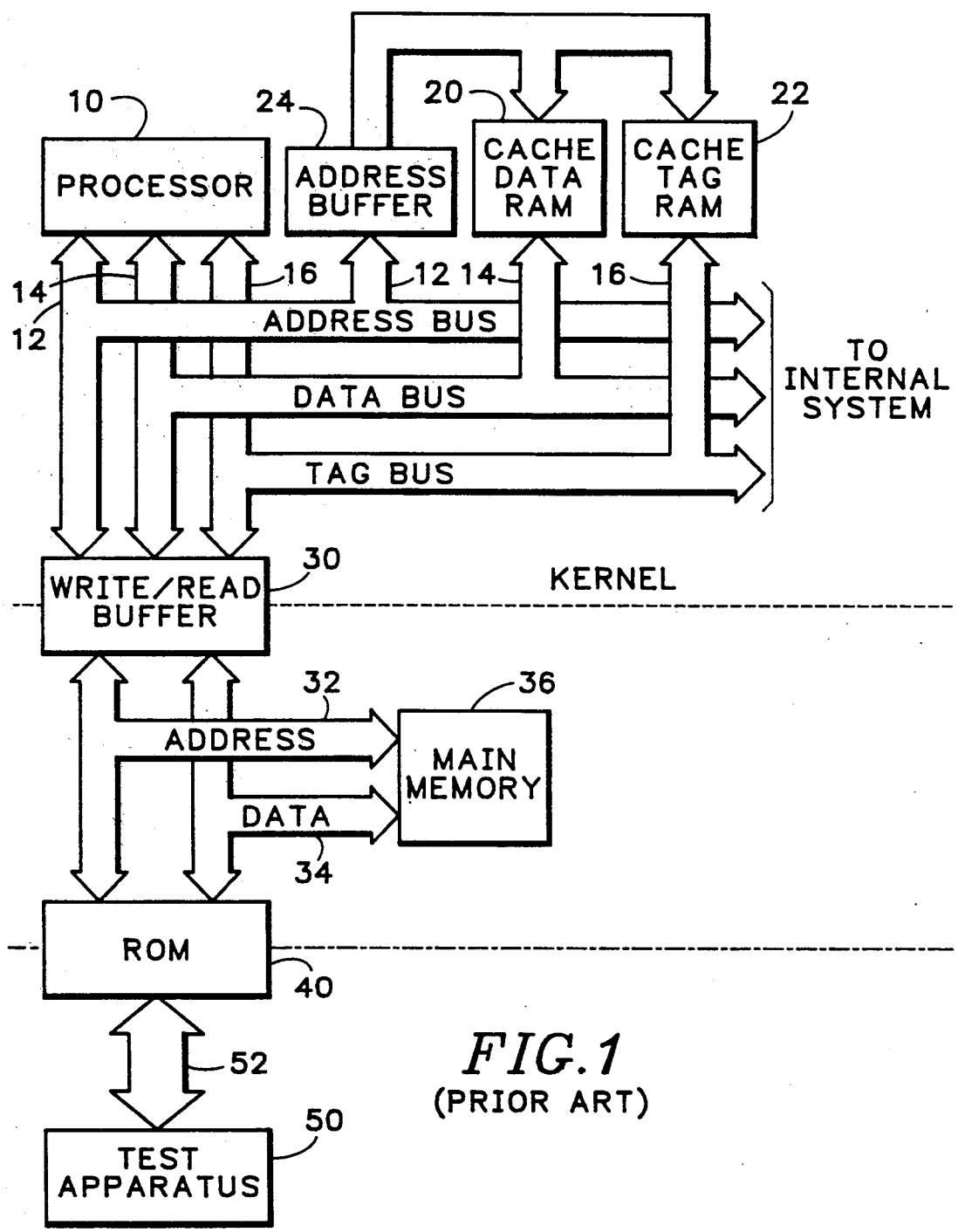
FIG. 1 is a partial block diagram of a prior art processor system showing a cache and its relationship to the overall system.

Referring now to the drawings, there is shown in FIG. 1 a partial block diagram of a prior art processor system in which a processor 10 is coupled to a bus structure which includes an address bus 12, a data bus 14, and a tag bus 16. Also coupled to the bus structure within the processor kernel are data and instruction caches. As is known to those skilled in the art, the number and size of caches may vary and depends upon the particular system; however, this information is available in the specification sheets of the particular system, and can be taken into account in developing any test procedures. Accordingly, for simplicity and ease of explanation, the cache memory shown in this example is a data cache including a cache data RAM 20 and a cache tag RAM 22. Cache data RAM 20 is coupled to data bus 14 for receiving data during "write" operations and outputting data during "read" operations. The associated cache tag RAM 22 is coupled to tag bus 16 for receiving tag bits during "write" operations and outputting tag bits during "read" operations. An address buffer 24 is coupled to the address bus 12 to apply the least significant bits of the address to the cache data and tag RAMs 20 and 22, respectively. A write buffer 30 provides access outside the kernel of processor 10. Address and data buses 32 and 34, respectively, couple the write buffer 30 to a main memory 36 and to a read-only memory (ROM) 40. A test apparatus 50 for functionally testing of memory devices in microprocessor-based units may be connected to the processor system via a suitable cable 52 connected to ROM 40 using conventional techniques, such as connecting directly into the ROM sockets or clipping on over the ROM. An example of commercially-available equipment representative of test apparatus 50 is the 9100 Digital Test System including a 9132A interface pod manufactured by John Fluke Mfg. Co., Inc.

Figure 2:
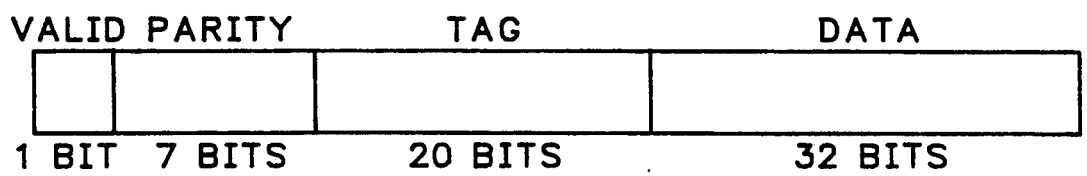
FIG. 2 is a bit map of a cache memory location used in a prior art processor system.

Test apparatus 50 loads the test instructions and test data into ROM 40. A program running in processor 10 reads the information in ROM 40 and stores test data in the cache data and tag RAMs. Accordingly, the cache tag RAM 22 is loaded with a sequence of patterns of logical ones and zeros that represent the tag bits, and the cache data RAM 20 is loaded with a sequence of patterns that represent data bits, wherein the data patterns are replications of the tag patterns. That is, the cache is loaded such that each cache memory location contains a matching pattern of logical ones and zeros in its respective corresponding tag and data RAMs. Refer to FIG. 2, which shows a bit map of a cache memory location using an R2000 RISC processor cache as an example. When a particular cache memory location is addressed by an R2000 processor, 32 data bits, 20 tag bits, 7 parity bits, and one valid bit are retrieved. For purposes of this discussion, we are interested in only the tag and data bits.

Figure 3:
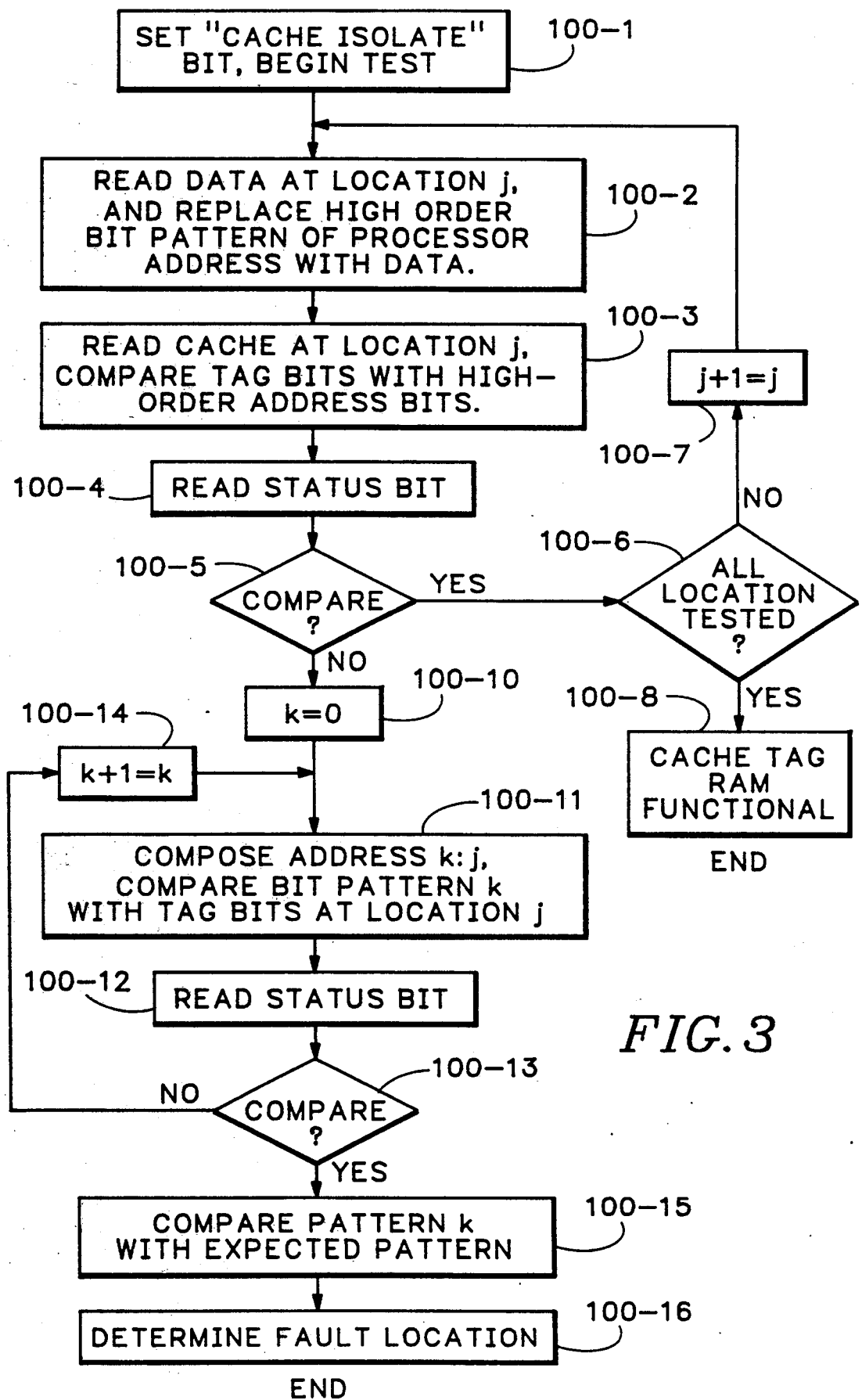
FIG. 3 is a flow chart of a test sequence in accordance with the present invention.

FIG. 3 is a flow chart of the test sequence comprises steps 100-1 through 100-16 in accordance with the present invention. We will assume that prior to testing the cache tag RAM, the associated data RAM will have already been functionally tested using conventional testing techniques and determined to be in proper working order.

First, in step 100-1, a cache isolate bit is set within processor 10 to isolate the cache for diagnostic access. It is important to keep in mind that in reading the cache memory, the address emitted by processor 10 is split into lower order address bits (the least significant bits) which are applied via address buffer 24 to the address inputs of RAMs 20 and 22, and upper order address bits (the most significant bits) which are used for comparison with the tag bits read from tag RAM 22. The desired low order address bits identifying a given cache memory location are concatenated with some arbitrary high order pattern (it does not matter what the high order bits are at this point), and a first "read" operation is performed (step 100-2). The data returned from RAM 20 is used to replace the high order bit pattern of the address, while retaining the aforementioned low order bit pattern. The cache is read again at the same location (step 100-3), this time comparing retrieved tag bits from tag RAM 22 with the high order bits of the address. If the comparison succeeds (a YES at step 100-5), the expected tag bits are present and known, and the next (j+1=j, step 100-7) cache memory location can be examined in the same manner. The process is iterative, that is, it repeats for each jth address, and as long as each comparison succeeds, processor 10 sequences through the tag RAM locations until the test is completed at step 100-8.

If the status bit read at step 100-4 in the processor 10 indicates that a comparison has failed, it is presumed that the bit pattern retrieved from the tag RAM 22 location is not what was expected due to a fault at that location. The test sequence is halted at the faulty location, processor 10 begins to try all possible patterns for the high order address bits (step 100-10 through 100-14) until one is found that matches the pattern retrieved from the tag RAM 22 faulty location. When a comparison is finally made at step 100-13, the matched pattern is transmitted to test apparatus 50, which has retained the expected pattern. A comparison of the returned pattern with the expected pattern (step 100-15) yields information as to the precise location of fault (step 100-16), including which chip(s) need to be replaced.

The test method described hereinabove has been implemented in R2000 RISC processor assembler level software and verified to be workable. The tag RAMs in the instruction cache or the data cache can be verified correct in about three seconds on a 12-MIPS R2000 board with maximum cache sizes, compared with about one second for the cache data RAMs.

While the second part of the fault determination process is a "brute force" approach and may involve up to more than a million possible combinations until a match is found, it actually takes only a few seconds (perhaps as much as ten seconds on a slow R2000 system with minimum-size caches).

While I have shown and described the preferred embodiment of my invention, and by way of illustration set forth the best mode contemplated by me of carrying out my invention, it will occur to those skilled in the art that the invention is capable of different embodiments, and several details are capable of modification in various ways without departing from my invention in its broader aspects. For example, the concepts taught here may be extended to any system in which visibility into the cache tag RAM contents is minimal.

What I claim is:

1. A method of functionally testing cache tag RAMs in systems having limited access to information contained in said cache tap RAMs, each of said cache tag RAMs corresponding to a cache data RAM having a series of address locations which are identical to a corresponding series of address locations of said cache tag RAM, comprising the steps of:

(a) loading said series of address locations of said cache tag RAMs and said corresponding series of address locations of said corresponding cache data RAMs with a sequence of test patterns such that identical address locations of said tag and data RAMs are loaded with identical test patterns;

(b) sequentially retrieving test patterns from each of said series of address locations of said tag RAMs and from each of said corresponding series of address locations of said data RAMs;

(c) comparing said test patterns retrieved from said series of address locations of said tag RAMs with test patterns retrieved from said corresponding series of address locations of said data RAMs at said corresponding identical address locations to determine existence of a fault at a faulty tag RAM address location having an unknown pattern of logic bits as indicated by a mismatch of said test patterns;

(d) applying a sequence of predetermined patterns of logic bits to a data RAM address location corresponding to said faulty tag RAM address location;

(e) iteratively comparing said unknown pattern of logic bits contained in said faulty tag RAM location with said sequence of predetermined patterns of logic bits until one of said predetermined patterns of logic bits matches said unknown pattern of logic bits contained in said faulty tag RAM address location; and (f) comparing said one of said predetermined patterns of logic bits with a known pattern of logic bits for said faulty tag RAM location to determine from the mismatch therebetween the location of the fault.

* * * * *